United States Patent [19]

DeLuca

[11] Patent Number: 4,647,477

[45] Date of Patent: Mar. 3, 1987

[54] SURFACE PREPARATION OF CERAMIC SUBSTRATES FOR METALLIZATION

[75] Inventor: Michael A. DeLuca, Holbrook, N.Y.

[73] Assignee: Kollmorgen Technologies Corporation, Dallas, Tex.

[21] Appl. No.: 679,220

[22] Filed: Dec. 7, 1984

[51] Int. Cl.$^4$ ............................................. C23C 18/18
[52] U.S. Cl. ...................................... 427/98; 156/663; 156/667; 204/38.4; 228/209; 427/305; 427/309
[58] Field of Search ......................... 427/98, 305, 309; 156/663, 667; 204/38.4; 228/209

[56] References Cited

U.S. PATENT DOCUMENTS

| | | |
|---|---|---|
| 3,296,012 | 1/1967 | Stalnecker . |
| 3,309,760 | 3/1967 | Reznick et al. . |
| 3,628,999 | 12/1971 | Schneble et al. . |
| 3,672,986 | 6/1972 | Schneble et al. . |
| 3,690,921 | 9/1972 | Elmore ................................ 427/305 |
| 3,772,056 | 11/1973 | Polichette et al. . |
| 3,772,078 | 11/1973 | Polichette et al. . |
| 3,907,621 | 9/1975 | Polichette et al. . |
| 3,925,578 | 12/1975 | Polichette et al. . |
| 3,930,963 | 1/1976 | Polichette et al. . |
| 3,959,547 | 5/1976 | Polichette et al. . |
| 3,993,802 | 11/1971 | Polichette et al. . |
| 3,994,727 | 11/1976 | Polichette et al. . |
| 4,428,986 | 1/1984 | Schachameyer ................... 127/309 |

FOREIGN PATENT DOCUMENTS

| | | |
|---|---|---|
| 3032508 | 4/1982 | Fed. Rep. of Germany . |
| 53-19932 | 2/1978 | Japan . |
| 58-167447 | 10/1983 | Japan ................................. 156/663 |

OTHER PUBLICATIONS

Ameen et al., *J. Electrochem. Soc.* 120 1518 (1973), "Etching of High Alumina Ceramics to Promote Copper Adhesion".

Baudrand, Plating and Surface Finishing, Oct. 1984, pp. 72-75 "Cleaning and Preparation of Ceramic and Metallized Ceramic Materials for Plating".

Delaney, "Copper Plated Ceramic Hybrids," pp. 394-398, Proceedings of the 1984 International Symposium on Microelectronics, Sep. 17-19, 1984 Dallas, Texas.

Jorgensen et al. "Copper Plated Ceramic Hybrids," pp. 394-398, International Society of Hybrid and Microelectronics, Montgomery, Alabama Sep. 1984.

Bogenschuetz et al., "CMS-Technique, A Process for the Adherent Metallization of Ceramic", May 3-4, 1981.

*Primary Examiner*—John D. Smith
*Attorney, Agent, or Firm*—Morgan & Finnegan

[57] ABSTRACT

A process for preparing a ceramic substrate for metallization wherein a surface of the ceramic substrate is contacted with an admixture comprised of an inert solid material and a composition containing one or more alkali metal compounds. The admixture and the substrate are heated at least to a temperature at which the alkali metal composition becomes molten. The molten alkali metal composition is kept in contact with the ceramic surface for a time period sufficient to etch the surface and thus prepare it for adherent deposition of metal. The presence of the inert solid material in the admixture prevents coalescence of the alkali metal composition on the ceramic surface. Uniform surface coverage with catalyst and metal and an adherent bond of metal to the ceramic surface are ensured by treatment with the admixture. Furthermore, an article comprised of metal directly and adherently bonded onto a ceramic substrate is provided.

29 Claims, No Drawings

SURFACE PREPARATION OF CERAMIC SUBSTRATES FOR METALLIZATION

BACKGROUND OF THE INVENTION

1. Field of the Invention

This invention relates to the surface treatment of ceramic articles for metallization and to a metal layer or a metallized conductor pattern directly and adherently bonded onto a surface of a ceramic substrate, and an improved process for producing the same. More particularly, this invention relates to a printed circuit pattern directly and adherently bonded onto a surface of a ceramic substrate, and an improved process for producing the same.

2. Description of the Prior Art

Metallized conductor patterns or uniform metal layers on ceramic substrates have been widely used in the electronic industry. For many years, ceramics have been metallized by high cost processes such as the ones using fused metal-glass pastes or by thin film vacuum deposition techniques. Attempts to reproducibly make circuit patterns by direct electroless deposition have not been successful due to poor adhesion of the metal films to the substrate and non-reproducible and non-uniform surface coverage.

Printed circuits on ceramics including alumina were described as early as 1947. See "Printed Circuit Techniques", National Bureau of Standards, Circular 468 (1947) and National Bureau of Standards, Misc. Pub. 192 (1948). One type, known as a thin film circuit, consists of a thin film of metal deposited on a ceramic substrate by one of the vacuum plating techniques. In these techniques, a chromium or molybdenum film, having a thickness of about 0.02 microns, acts as a bonding agent for copper or gold conductors. Photolithography is used to produce high resolution patterns etched from the thin metal film. Such conductive patterns may be electroplated, up to 7 microns thick. Due to their high cost, thin film circuits have been limited to specialized applications such as high frequency applications and military applications where a high pattern resolution is vital.

Another type of printed circuit, known as a thick film circuit, consists of circuit conductors composed of a metal and glass film fired on a ceramic substrate. Typically, the film has a thickness of about 15 microns. Thick film circuits have been widely used; they are produced by screen printing in a circuit pattern with a paste containing a conductive metal powder and a glass frit in an organic carrier. After printing, the ceramic parts are fired in a furnace to burn off the carrier, sinter the conductive metal particles and fuse the glass, thereby forming glass-metal particle conductors. The conductors are firmly bonded to the ceramic by the glass. Components may be attached to such conductors by soldering, wire bonding and the like.

Conductors in thick film circuits have only 30–60 percent of the conductivity of the respective pure metal. However, high conductivity of pure metal is needed to provide interconnections for high speed logic circuits. Because conductors in thick film circuits do not have such high conductivity, they do not provide optimum interconnections for high speed logic circuits.

The minimum conductor width and the minimum space between conductors which can be obtained by screen printing and firing under special high quality procedures is 125 and 200 microns, respectively. However, under normal production conditions, these minima are 200 and 250 microns, respectively.

Attempts have been made to directly bond pure metal conductors to ceramic substrates including alumina in order to achieve high conductivity for ceramic based circuit patterns. See U.S. Pat. No. 3,744,120, to Burgess et al. and U.S. Pat. No. 3,766,634 to Babcock et al. *Solid State Technology* 18/5, 42 (1975) and U.S. Pat. No. 3,994,430, to Cusano et al. describe a process for bonding copper sheets to alumina by heating the copper in air to form an oxide film on its surface. The treated copper sheet is bonded by the agency of this film to alumina at a temperature between 1065° C. and 1075° C. in a nitrogen furnace. In order to obtain well adhered copper foil without blisters: (1) the copper foil must be carefully oxidized to provide a black surface; (2) the copper oxide thickness must be carefully controlled; (3) the amount of oxygen in the copper foil must be controlled; (4) the oxygen content of the nitrogen furnace must be maintained at a controlled level to maintain a very moderately oxidizing atmosphere; and (5) the temperature must be controlled within one percent. This carefully controlled high temperature operation is difficult and expensive to tool for, to operate and to control. If the aforementioned extremely stringent controls are not maintained, blisters and other adhesion failures between the copper foil and the substrate are apparent. In spite of the difficult operating conditions, the process of Cusano et al. is being introduced into commercial application because of the need for the metallized product.

Although the above described systems are commercially used, the need for direct, simple metallization of ceramics with a layer or pattern of a pure metal conductor, such as copper, has prompted a continuous series of patents and proposed processes. See for example Apfelbach et al., Deutsches Patentschrift (DPS) No. 2,004,133; Jostan, DPS No. 2,453,192 and DPS No. 2,453,277; and Steiner DPS No. 2,533,524.

Other processes for producing printed circuit patterns on ceramic substrates are disclosed in U.S. Pat. Nos. 3,772,056; 3,772,078; 3,907,621; 3,925,578; 3,930,963; 3,959,547; 3,993,802 and 3,994,727. However, there is no teaching in all these patents of how to adhesion promote ceramic surfaces.

See also U.S. Pat. No. 3,296,012 to Stalnecker which discloses a process for producing a microporous surface for electrolessly plating alumina. Attempts to simply apply electroless metallization directly to ceramic substrates, have continually been tried and never been commercially successful. Toxic and corrosive materials such as hydrogen fluoride were tried to allow the direct bonding of electroless by formed metal deposit to ceramics without the use of firing temperatures. See, e.g., Ameen et al., *J. Electrochem. Soc.*, 120, 1518 (1973). However, the hydrofluoric etch gave poor bond strength due to the resulting surface topography.

U.S. Pat. No. 4,428,986 to Schachameyer discloses a process for direct autocatalytic plating of a metal film on beryllia. The process comprises uniformly roughening the surface by immersing the beryllia in a 50% sodium hydroxide solution at 250° C. for 7 to 20 minutes, rinsing with water, etching the beryllia with fluoboric acid for 5 to 20 minutes to attack the glass alloying constituents, rinsing with water, immersing the beryllia in a solution of 5 g/l stannous chloride and 3N hydrochloric acid, rinsing with water, followed by treating with 0.1 g/l palladium chloride solution, rinsing with water, and then electrolessly plating nickel on the beryllia. However, the etching step removes the silica and magnesium from the grain boundaries of the beryllia, thereby weakening the beryllia surface. As a result, the process of Schachameyer was able to achieve only 250 psi (1.7 MPa) bond strength before the beryllia substrate broke. This bond strength is only about a third of the bond strength normal in thick film type circuits and for many purposes not adequate.

U.S. Pat. No. 3,690,921 to Elmore discloses the application of a concentrated sodium hydroxide solution to the surface of a ceramic substrate. The ceramic substrate is heated to drive off the solvent (water) and is heated further to melt the sodium hydroxide and etch the ceramic surface. The molten sodium hydroxide has a tendency to coalesce on, and not uniformly wet, the ceramic surface. Smooth ceramic surfaces, e.g., having a surface roughness below 0.13 micrometers (5 microinches) are difficult to completely wet with molten sodium hydroxide. As a result, uneven etching of ceramic surfaces, particularly smooth ceramic surfaces, results with the use of molten sodium hydroxide. In the best cases, when a metal is subsequently bonded to the ceramic surface, the bond strength is uneven across the ceramic surface. In the worst case, there is no adhesion of metal in some areas of the ceramic surface, or even no metal deposit because there was no adhesion of the electroless plating catalyst. Thus, the process described by Elmore did not achieve commercial production.

U.S. application Ser. No. 502,748, filed June 9, 1983, "Metallization of Ceramics" by M. DeLuca et al., now abandoned discloses processes for improving surface coverage of electrolessly deposited metals by treatment of a ceramic surface by etching with a melt comprised of alkali metal compounds and contacting the surface with an acidic halide solution in a pre-treatment step immediately followed by, or constituting part of, the solutions employed in the catalyzing sequence for rendering the surface receptive to electroless deposition of metal. When the alkali metal compounds are applied to a very smooth ceramic surface, such as 99% alumina, either as aqueous solutions or as powder mixtures, as described in U.S. application Ser. No. 502,748, now abandoned coalescence occurs in the melt on the smooth ceramic surface.

All of the aforementioned processes for depositing metals on ceramic surfaces which include a etching step using alkali metal compounds in a molten state do not guarantee uniform adhesion promotion of the ceramic substrate.

The trend in ceramic printed circuit manufacturing is toward smoother and more uniform surface topography. A smooth surface provides better conductor definition and improved parameters for propogation of very high frequency signals at the substrate-conductor interface.

Unfortunately, the smoother the ceramic surface, the lower the net surface energy. As a result, the alkali metal compound does not completely wet such smooth ceramic surfaces having surface roughnesses of, e.g. 0.6 micrometers. During the fusion step, the liquid caustic tends to coalesce into one or more areas on the surface of the substrate to achieve lower net surface energy. This problem is greatest on the smooth surfaces of 99% pure electronic grade alumina. 89 to 96% alumina is somewhat easier to wet, although it frequently is difficult to achieve satisfactory results on a manufacturing scale. This results in a less than uniform surface etch and thus defective surface texture.

Total immersion of an alumina substrate in molten sodium hydroxides gives a uniform but severe surface etch. The severe surface etch results in a rough surface which does not permit fine conductor line resolution. In addition, such total immersion also tends to weaken the intrinsic structural integrity of the ceramic substrate resulting in cracks, especially in ceramic substrates provided with drilled holes.

As the purity of the ceramic increases, the surface also becomes smoother. Attempts to etch, for example, 99.5% pure electronic grade alumina by the procedures described in the Elmore U.S. Pat. No. 3,690,921, tend to result in a surface that is highly non-uniform.

Since 99.5% electronic grade alumina is normally used for microwave circuitry, surface roughness caused by deep etching must be avoided in order not to disturb the microwave signal propagation. However, it has not been possible to obtain a uniform, adherent metallization of smooth 99.5% alumina substrates by the procedures disclosed in Elmore U.S. Pat. No. 3,690,921 and/or DeLuca et al. U.S. application Ser. No. 502,748, filed June 9, 1983 now abandoned.

Non-uniform etching causes non-uniform adhesion of metal deposits, e.g., conductor-to-substrate and even areas of no adhesion or no conductor. It would be advantageous to be able to wet the ceramic more uniformly with an alkali metal compound, such as NaOH, and to be able to maintain uniform liquid-to-solid contact throughout the fusion process. This would result in a more consistent etching of ceramics and uniform adhesion of metal deposits formed on the surface of such ceramic substrates.

SUMMARY OF THE INVENTION

1. Objects of the Invention

An object of the present invention is to provide a process for applying a metal film on a ceramic substrate and obtain excellent surface coverage and a bond strength of at least 3 MPa, preferably at least 5 MPa.

Another object of the invention is to provide an improved process for adhesion promoting surfaces of ceramic substrates containing >89% alumina for adherent metallization.

A further object of the invention is to produce a metal plated ceramic substrate which may be used for fine line circuit applications with highly pure metal conductors.

Still another object of the invention is to provide a reliable process for metallizing the surfaces of 98 to 99.5% alumina substrates without creating a rough, deep etched surface.

It is also an object of the invention is to provide an electrolessly deposited, direct bonded conductor or conductor pattern having excellent adhesion to a ceramic substrate, and a process for producing the metal coated ceramic substrate.

An object of the invention is to provide a ceramic substrate with securely attached metal conductors forming an interconnection network suitable for high speed logic circuits and a process for producing plated substrates suitable for the manufacture of, or for the manufacturing of, said interconnection networks.

An object of the invention is to provide a two-sided metal plated ceramic substrate with a through hole conductor pattern and a conductor density comparable to a three or four layer, thick film, multilayer ceramic.

Additional objects and advantages of the invention will be set forth in part in the description, or may be realized by practice of the invention, the objects and advantages being realized and attained by means of the methods, processes, instrumentalities and combinations particularly pointed out in the appended claims.

2. Brief Description of the Invention

It has been discovered that molten alkali metal compositions do not always uniformly wet the surfaces of ceramic substrates. Surprisingly, an alkali metal etchant composition tends to coalesce onto one or more areas of the ceramic surface leaving other areas of the ceramic surface devoid of etchant. Heating the etchant above its melting temperature exacerbates dewetting of the ceramic surface. It is believed that the high surface tension of the molten alkali metal composition on the low surface energy ceramic substrate tends to cause the coalescence. However, applicant has found that by employing an admixture comprised of an inert solid material and a composition containing one or more alkali metal compounds, and optionally containing one or more ingredients which depress the melting point of the alkali metal compound(s), dewetting of the ceramic surface is prevented even when the alkali metal composition is heated to a temperature above its melting point. By an inert solid material as used herein is meant a material which is not completely dissolved by a melt of the alkali metal composition during the adhesion promoting step of the process of this invention.

The present invention is directed to a process for producing metal films or deposits on ceramic substrates including alumina, which have excellent surface coverage and bond strength (i.e., at least 3 MPa, preferably at least 5 MPa) as measured by the "dot pull test" described herein below. The present invention also includes ceramic substrates having printed circuit patterns formed from such films or deposits. The process of this invention may be used to treat ceramic substrates for electroless or electrolytic metal deposition. With the process of this invention, metal deposits on the ceramic substrate may be obtained having a thickness of at least 0.2 microns, preferably at least 2 microns, and printed circuit pattern conductor features with a width as low as 50 microns, and even as low as 25 microns.

The process of this invention comprises the steps of: (a) contacting the surface of a ceramic substrate with an admixture comprised of an inert solid material selected from particles, films, fibers and webs and a composition containing one or more alkali metal compounds and optionally containing one or more melting point depressants for the composition; (b) heating the substrate and the admixture to a temperature at which the alkali metal composition becomes molten thus adhesion promoting the surface of the ceramic with the heated admixture; and (c) depositing metal on the ceramic surface.

In one form, the admixture is an aqueous solution of the alkali metal composition throughout which is dispersed an inert solid material. In another form, the alkali metal composition exists as a solid and uniformly dispersed therein is an inert solid material. The admixture in another embodiment can be a fibrous web or a film or an inert solid material which supports and prevents coalescence of the alkali metal composition in the liquid state. The admixture must be stable, i.e., the alkali metal composition must not completely dissolve the inert solid material in the admixture, before the molten alkali metal composition wets the ceramic surface.

The admixture preferably is heated in situ after application to the ceramic surface to be adhesion promoted. Alternatively, the admixture and/or ceramic surface may be separately preheated before the admixture is applied to the ceramic surface to be adhesion promoted.

The admixture may be formed by a number of techniques, including: (1) dispersing inert solid particles, in an aqueous solution of an alkali metal compound or by dispersing the inert solid particles in a liquid alkali metal composition comprised of an alkali metal compound and optionally including a melting point depressant for the composition, the liquid composition having been heated above the melting point of the composition; (2) forming a melt of an alkali metal compound having inert solid particles dispersed therein by grinding the alkali metal composition and the inert solid material together and heating to form the melt; and (3) impregnating a fibrous base comprised of the inert solid material with a solution or melt of the alkali metal composition, and then optionally drying or solidifying same.

Inert solid materials in the form of particles, films, fibers, etc., which are not dissolved or melted by the molten alkali metal composition up to and during an adhesion promotion step are preferred.

3. Detailed Description Of The Invention

In one aspect, this invention concerns an improvement in a process for metallizing a surface of a ceramic substrate which includes adhesion promoting the surface with an alkali metal composition containing one or more alkali metal compounds and subsequently depositing metal on the adhesion promoted surface. The improvement comprises providing an admixture comprised of said alkali metal composition and an inert solid material; contacting the ceramic surface with the admixture; heating the admixture and the substrate for a time period and at or above a temperature at which the alkali metal composition become molten and which is sufficient to adhesion promote the ceramic surface, and render it receptive to subsequent adherent metal deposition. The presence of the inert solid material in the admixture prevents coalesence of the alkali metal composition on the ceramic surface during adhesion promotion.

In another aspect, this invention concerns an improvement in a process for adhesion promoting a surface of a ceramic substrate to receive an adherent metal deposit, the ceramic surface preferably having a surface roughness less than about 0.7 micrometers. The process includes adhesion promoting the surface with an alkali metal composition at an elevated temperature. The improvement comprises providing an admixture comprised of said alkali metal composition dispersed throughout one or more inert solid materials which will remain solid in the presence of the alkali metal composition in a molten state and which will prevent coalescence of the alkali metal composition on the ceramic surface at least until the alkali metal composition wets the ceramic surface; and contacting the ceramic surface with the admixture at a temperature above about 150° C. and for a time period sufficient to adhesion promote the ceramic surface.

In another aspect, this invention concerns a process for producing a printed circuit on a surface of a ceramic substrate comprising:

(a) contacting the ceramic surface with a molten alkali metal composition comprised of an alkali metal compound and an inert solid material in finely divided form to adhesion promote the surface;

(b) treating the ceramic surface to activate it for electroless metal deposition;

(c) depositing metal onto the activated surface;

(d) removing portions of the deposited metal to produce a metal printed circuit conductor pattern adhering to the surface of the ceramic substrate.

In still another aspect, this invention relates to a ceramic article comprised of a ceramic substrate with a uniform coating of metal adherently bonded to a surface thereof. The metal coating is formed by treating the surface of the ceramic substrate with a molten alkali metal composition comprising one or more alkali metal compounds and inert inorganic oxides in particulate form; adsorbing catalyst on the surface; and depositing a coating of metal on the surface from a metal depositing bath. These articles may be used as hermetic seals, the metal forming a hermetic seal at its interface with the surface of the ceramic.

According to the process of this invention, the ceramic surface is adhesion promoted by contact with liquid alkali metal composition at a temperature and for a time period sufficient to adhesion promote the ceramic surface. Adhesion promotion is a chemical modification of the ceramic surface which renders it receptive for a uniform well-bonded metallic overplate. After the ceramic substrate has been adhesion promoted, it is cooled and residual admixture on the ceramic surface is removed, e.g., by washing. The ceramic surface then may be metallized by conventional techniques.

In one metallization technique, the adhesion promoted ceramic surface which has been cooled to room temperature and washed in water, is neutralized in an acid and again rinsed in water. The surface is then sensitized or catalyzed for plating.

Any metal film may be deposited on the surface of a ceramic substrate in accordance with the present invention. Typically, copper, nickel, silver, gold, tin or cobalt films or deposits are electrolessly deposited.

Ceramic substrates suitable for use according to the present invention include aluminas, beryllias, carbides such as silicon carbide and silicon carbide/beryllia, titanates, such as barium titanate, and nitrides such as silicon nitride. Beryllium nitride is believed to be a suitable ceramic substrate. Other ceramic substrates which are believed to be suitable for use according to the present invention include silicates, forsterite, mullite, steatite, porcelains, and mixtures of the foregoing such as cordorite, which is a magnesia, alumina, silica mixture. Preferred ceramic substrates include 94 to 99.5% aluminas and silicon nitrides. The process of this invention is preferred for aluminas having a surface roughness between about 0.05 and 0.7 micrometers.

Preferably, the ceramic substrates are washed or degreased in a hot alkaline cleaner to remove any dirt, debris, grease, fingerprints, etc.

The surface of the ceramic substrate is adhesion promoted with an admixture comprised of an alkali metal composition and a solid material selected from the group consisting of particles, films, fibers and webs.

Many alkali metal compounds are suitable for adhesion promotion of ceramics. It is preferred to use compounds with lower melting points.

The melting points of the alkali metal compound(s) with the suspension of inert particles therein may be depressed by dissolving up to 50% by weight, preferably up to 20% by weight, of low melting materials or even liquids in the alkali metal compound(s) to obtain low melting alkali metal compositions. Examples of such melting point depressants which are believed to to be within the scope of this invention include stannous chloride, nitric acid, water, sodium and potassium formate, potassium acetate, Rochelle salts, borax, and the hydrates of lithium bromide, iodide, and phosphate, and potassium pyrophosphate. Sometimes, it may be preferable to avoid the hydroxides for safety reasons and for ease of neutralization. Typical alkali metal compounds suitable for use in this invention and their melting points as reported in *Lange's Handbook of Chemistry*, Eleventh Edition (1972) are as follows:

| Alkali Metal | Melting Points °C. | | |
|---|---|---|---|
| | Anion | | |
| | Hydroxide | Nitrate | Carbonate |
| Lithium | 445 | 261 | 618 |
| Sodium | 328 | 308 | 851 |
| Potassium | 360 | 334 | 891 |
| Rubidium | 300 | 310 | 837 |
| Cesium | 272 | 414 | — |

Eutectic mixtures such as a mixture of potassium hydroxide and sodium hydroxide or a mixture of sodium carbonate and potassium nitrate also may be used to etch the substrate. The former type of mixture preferably has a percent by weight ratio of 59:41 of KOH to NaOH with a melting point of 170° C.

The alkali metal compositions used as etchants should be heated to a temperature above their melting point. Depending upon the amount of melting point depressant(s) present, the etchant composition is heated to a temperature above about 150° C., preferably above about 300° C., and more preferably between about 450° C. and about 650° C.

Preferred alkali metal compounds for the etchant composition include sodium hydroxide, potassium hydroxide, and sodium carbonate and potassium nitrate.

A wide variety of inert solid particles can be used with the alkali metal composition. Certain criteria are important in choosing the particles.

The particles should not readily melt or dissolve in the melt of the alkali metal composition. The particles also should not be so fine that considerable blocking of etching sites results, or be so coarse that they do not uniformly cover the surface with the melt.

The concentration of the particles is preferably not below approximately 1% by volume of the alkali metal composition. Particle size distribution is not very critical except that an excessive quantity of smaller-size particles (i.e., approx. 200 mesh) has a tendency to block the substrate surface and thus reduce etching efficiency. It is believed that there must be a sufficient quantity of free alkali metal compound at the surface of the substrate to properly attack the ceramic.

It is believed that the upper limit is controlled by the size of the particle lying on the substrate. Particles much greater than 40 mesh may tend to cover a sizable projected area below the substrate and also may tend to limit the effectiveness of the etching process.

Preferred solid materials include alumina particles e.g., chromatographic grade, alumina, 80–200 mesh, and clays, e.g., kaolin.

Other materials believed to be suitable as the inert solid particles dispersed in the admixture include the following: titanium dioxide, zirconium oxides, zirconium silicate, yttria, ytterbia, uranium dioxide, wolframite, thulia, terbia, terbium peroxide, tantalum (IV) oxide, silicon carbide, strontium metasilicate, strontium orthosilicate, molybdenum oxides, manganese silicides, magnetite, ferrous silicide, ferrous orthosilicate, germanium oxides and hydrated aluminas.

In addition, various combinations of pulverized minerals or ceramic materials (i.e., pulverized electronic grade $Al_2O_3$ containing a variety of glassy binders) believed to be suitable as the solid particles include: steatite, barium titanate, porcelains, mullite, forsterite, alumina, mullite, mica, zirconium porcelains, bentonite, cryolite, kyamite, magnesium titanate, calcium titanate, strontium titanate, strontium bititanate, neodymium titanate, rare earth titanates, barium zirconate, magnesium zirconate, calcium zirconate, strontium zirconate, bismuth zirconate, barium stannate, magnesium stannate, calcium stannate, strontium stannate, bismuth stannate, flint, feldspar, ilmenite, chromite, fused magnesia-chrome, cristobalite, barium zirconium-silicate, Portland cement, fired refractory brick.

Suitable fibers are believed to include chopped fibers such as glass fibers, mineral fibers and the like; and metal fibers, carbon fibers and ceramic fibers.

Suitable films and webs are believed to include mineral or glass mats, glass cloths, glass felts, metal cloths, metal screens, and glass papers.

Suggested procedures for metallizing ceramic surfaces etched with molten alkali metal compounds are described in U.S. Ser. Nos. 502,748, filed June 9, 1983 now abandoned, U.S. Ser. No. 607,874, filed May 10, 1984, now U.S. Pat. No. 4,574,894, and U.S. Ser. No. 611,193, filed May 21, 1984, now U.S. Pat. No. 4,604,299 all to M. DeLuca et al., the disclosures of which are incorporated herein by reference. These procedures may be used herein.

It has been discovered that an admixture comprised of a dispersion of alumina particles in an alkali metal solution, e.g., sodium hydroxide solution, becomes more gelatinous and turbid in appearance after aging. By aging is meant the equivalent of passing of at least 12 hours at room temperature. A typical aging period is one day. Aged admixtures can be used for a time period in excess of three months. Surprisingly, when such an aged admixture rather than an unaged admixture is employed in the process of this invention, metal films are obtained which adhere to the ceramic substrate even more uniformly across the ceramic surface. Thus, the use of aged admixtures in the process of this invention are preferred.

Ceramic surfaces can be adhesion promoted or suitably etched with molten alkali metal compositions at temperatures between about 150° C. and about 1200° C. Aluminas should be etched with molten alkali metal compositions at a temperature above about 450° C, preferably above about 550° C., and at a temperature below about 700° C., preferably below about 650° C. At temperatures below 450° C., the etch of the alumina surface tends to be non-uniform with some pits. At temperatures of 700° C. and above, the etch of the alumina surface is uniform but undesirably deep and rough.

It is believed that silicon carbide-beryllium oxide should be etched with molten alkali metal compositions at the same temperatures used for aluminas.

Titanates should be etched with molten alkali metal compositions at a temperature above about 170° C., preferably above about 200° C., and below about 450° C., preferably below about 400° C. Titanates containing glasses which rapidly dissolve in molten alkali metal compositions or containing more than 10% glasses should be etched at temperatures between about 170° C. and about 250° C.

Silicon nitride should be etched with molten alkali metal compositions at a temperature above about 250° C. and below about 350° C., preferably about 300° C.

Among the methods of heating the ceramic substrates to fuse the alkali metal composition are ovens, muffle furnaces and conveyorized muffle furnaces. The substrates coated with an admixture of this invention may be placed in a oven or furnace on inert supports such as graphite. Since the portion of the substrate in contact with the inert support will frequently not be adequately adhesion promoted or etched, the point of contact between the substrates and the support should be a position on the substrate that does not require adherent metallization.

The ceramic surface should be etched for a time period sufficient to increase its available surface area and render it receptive to adherent metallization. The preferred time for etching aluminas and beryllias with the molten alkali metal compositions is between 5 minutes and 20 minutes. For ceramic substrates with lower melting points (less refractory), such as titanates, mullite, fosterite, steatites and porcelains, the preferred time for etching with the molten alkali metal compositions is less than 5 minutes.

Typical of the metal deposition solutions used are electroless plating solutions such as nickel, cobalt, gold, tin and copper. See U.S. Pat. Nos. 3,485,643; 3,607,317; 3,589,916; 4,269,625; and the like. Electrolytic deposition solutions also may be used in the practice of this invention.

The use of unitary catalyst solutions prepared from both stannous chloride and palladium chloride is well known in the printed circuit and plating-on-plastic arts. Typical catalyst solutions are in U.S. Pat. No. 4,187,198 to Zeblisky and U.S. Pat. No. 3,961,109 to Kremer et al. Such catalyst solutions may be advantageously used in plating on ceramics over the two step sensitizing and seeding solutions as described by Elmore.

Other precious metal catalyst solutions such as those described by Jung et al., U.S. Pat. No. 4,015,992 and Ehrich et al; U.S. Pat. No. 4,248,632 also may employed for carrying out this invention.

Non-noble metal catalysts for electroless metal deposition also may be used for carrying out this invention. Suitable non-noble metal catalysts include those and described by Polichette et al. U.S. Pat. Nos. 3,772,056; 3,925,578; and 3,993,802; 3,907,621; and those described by Nuzzi U.S. Pat. No. 3,962,494 and Nuzzi et al. U.S. Pat. Nos. 4,199,623 and 4,259,113, the disclosures of which are incorporated herein by reference.

Suitable procedures for catalyzing for electrolessly depositing metal are described in U.S. Ser. No. 502,748, filed June 9, 1983, U.S. Ser. No. 607,874, filed May 10, 1984, and U.S. Ser. No. 611,193, filed May 21, 1984, all to M. DeLuca et al.

Although we do not wish to be bound by theory, it is believed that the inert solid particles added into the alkali metal composition act as local sites for the composition to wet the surface. These numerous local sites tend to spread the composition containing the alkali metal compound(s) more uniformly than without the particles. The apparent wetting of the substrate allows for a more uniform etching of the substrate during the fusion process.

Numerous processes are employed in the manufacture of printed circuit boards. As will be understood by those skilled in the art, these printed circuit manufacturing processes may be used in conjunction with the adhesion promoting step of this invention and with the step of rendering the ceramic surface receptive to metallization in order to produce metallized ceramic printed circuit boards.

According to this invention, there are provided processes for applying adherent metal layer(s) to a ceramic surface which layer(s) can be used to join two or more metallized ceramic surfaces or to join metallized ceramic surfaces to metal articles by standard metal joining techniques such as soldering, brazing and welding. Furthermore, this invention provides processes for forming a hermetic seal of a metal layer to a ceramic substrate. This invention also provides a hermetically sealed ceramic package for microcircuits and other applications.

By "hermetic seal" as used throughout this specification, is meant one which passes the fine leak tests of MIL-STD-883B, Method 1014.3 (May 16, 1979), incorporated herein by reference.

As will be well understood by those skilled in the art, these hermetic seals are suitable for hybrid packages, chip carriers, integrated circuit packages, flat packs, dual-in-line packages and optoelectronic packages. In forming a hermetic seal to a ceramic substrate by the processes of this invention, a surface of the ceramic substrate is first provided with a metal layer, by the procedures described above. The metal layer on the ceramic surface then is joined to a metal or to another metallized ceramic substrate by standard metal joining techniques, typically soldering.

Other modes of operating this invention are, inter alia, disclosed in the examples.

EXAMPLE I

A black alumina ceramic substrate (90% alumina) measuring 75 mm×75 mm×0.63 mm was cleaned in a hot alkaline cleaning solution (Altrex NP commercially available from BASF Wyandotte, Wyandotte, Mich.) at 50° C. for 5 minutes. It then was rinsed in water and allowed to dry.

An adhesion promotion admixture was prepared by stirring 2% alumina powder (80–200 mesh activated alumina type F-20 Alcoa) into a 50% aqueous sodium hydroxide solution. The volume of the dry alumina powder was 2% of the volume of the 50% sodium hydroxide solution. The alumina powder was stirred into the sodium hydroxide solution with a stir bar and a magnetic stirrer. Stirring was continued for one hour to avoid agglomeration.

The ceramic substrates were placed in a polypropylene holder and immersed in the admixture with stirring to prevent settling of the alumina particles. The polypropylene holder containing the substrates was removed and excess admixture was allowed to drip off.

The ceramic substrates then were removed from the holder and placed horizontally on graphite end supports. The supports were in contact with a 3 mm wide segment at each end of the substrate.

The coated substrates were placed in a muffle furnace at 600° C. for 7 minutes and thus adhesion promoted.

Subsequently, the substrates were removed from the oven and allowed to cool for 5 minutes. The adhesion promoted substrates were then placed in a water rinse for 2 minutes to remove the bulk of the fusion products.

The remainder of the fusion products were removed by immersing the substrates in a 35% sulfuric acid solution for 2 minutes with slow agitation. This was followed by a rinse with water.

The parts were then metallized by the following proceedure:

(1) Immerse for 2 minutes in an aqueous conditioner solution containing an amphoteric surfactant (tallow betaine surfactant), a nonionic surfactant (nonylphenoxy polyethoxyethanol) and ethanolamine, the solution adjusted to pH 2.

(2) Rinse in water for 2 minutes.

(3) Place the parts in an aqueous halide predip solution of 3.8 moles sodium chloride, 0.1 moles hydrochloric acid, and 0.025 moles stannous chloride per liter.

(4) Immerse the substrate for 3 minutes at 40° C. in a palladium tin activator. The activator is prepared by diluting 31 millimeters of a concentrate prepared according to U.S. Pat. No. 3,961,109 to Kremer et al. diluted with 970 milliliters of the halide predip solution to achieve:

| | |
|---|---|
| Palladium ion | 75 mg/l |
| Stannous Chloride | 13.6 g/l |
| Sodium Chloride | 3.7 mol/l |
| Resorcinol | 0.75 g/l |
| HCl | 0.2 mol/l |

(5) Rinse for 2 minutes in water.

(6) Place the parts in an accelerator solution consisting of 3% fluoroboric acid in water.

(7) Immerse the substrates in an electroless copper bath at 30° C. to deposit 1.8 micrometers thickness of copper. The plating solution consists of:

| | |
|---|---|
| Ethylenediamine Tetra 2-Propanol | 20 g/l |
| Copper chloride | 6.1 g/l |
| Formaldehyde | 8 g/l |
| Sodium hydroxide | 15 g/l |
| Sodium cyanide | 0.01 g/l |
| 2,2-Dipyridyl | 0.03 g/l |
| Wetting agent (A block copolymer polyoxyethylene and polyoxypropylene commercially available as Pluronic P-85 TM from BASF Wyandotte Corp., Wyandotte, Michigan.) | 0.01 g/l |

After metallizing the ceramic substrates were electroplated in a copper electroplating bath to build up the copper thickness to 25 micrometers.

EXAMPLE II

Example I was repeated except that a white alumina substrate (96% alumina) was used.

EXAMPLE III

Example I was repeated except that a smooth white substrate (99.5% alumina) was used and the metallization step was changed as follows:

In step four (4) the 99.5% alumina is immersed for 10 minutes at 55° C.

After step seven (7) steps 3–7 are repeated.

EXAMPLE IV

Example I was repeated using a silicon nitride substrate measuring 12 mm×10 mm×6 mm. The parts were heated for 7 minutes at 300° C. instead of 7 minutes at 600° C. as in Example II. The bond strength was measured using the dot-pull test. The substrates were imaged and etched by conventional photolithographic techniques to produce ten copper dots 2.5 mm in diameter. Wires were attached to the copper dots with solder and the average bond strength was measured as the dots were pulled away from the ceramic surfaces. The average bond strength measured by the dot-pull test was 26.9 MPa (3898 psi).

In a comparison test the parts were treated at 600° C. as in Example II and the surface was severely roughened and became weak and porous.

EXAMPLE V

Example I was repeated with a barium titanate substrate. For this substrate, the oven temperature was 300° C. rather than 600° C. as in Example I.

EXAMPLE VI

Example II was repeated except that 20% by volume alumina powder was added to the 50% sodium hydroxide solution and the substrates were heated at 600° C. for 15 minutes.

EXAMPLE VII

Example VI was repeated except that the following electroless copper deposition solution was used at a temperature of 74° C.

| | |
|---|---|
| Copper sulfate | 0.028 moles/l |
| Ethylenediaminetetracetic (EDTA) | 0.08 moles/l |
| Formaldehyde | 0.073 moles/l |
| Cyanide (140 mV measured with an Orion Specific Ion Electrode vs. SCE) | 0.1 m mole/l |
| pH (25° C.) | 11.5 |
| Sodium Sulfate | 0.36 moles/l |
| Sodium Formate | 0.72 moles/l |
| Wetting Agent (Nonylphenyl Polyethoxy Phosphate-Commercially available as Gafac RE-610 from GAF Corp) | 0.1 grams/l |

One micrometer of electroless copper was deposited followed by electroplating. In order to establish the reproducibility of this process, one alumina substrate a day was processed for 50 consecutive days. Ten dots were tested on each substrate. The 500 dots tested in this program gave an average bond strength of 13.8 MPa (2000 psi).

EXAMPLE VIII

Example VI was repeated using 10% by volume of alumina powder in 50% sodium hydroxide.

EXAMPLE IX

Example VI was repeated except that after the substrate had been adhesion promoted, rinsed, neutralized in sulfuric acid solution, rinsed, immersed in cleaner conditioner, and rinsed, it was then activated with a catalyst for electroless plating using the Neoganth 834 TM, a product of Schering AG, 1000 Berlin, (believed to be a palladium complex compound containing organic nitrogen compounds as described in Ehrich et al., U.S. Pat. No. 4,428,632).

After immersion in the Neoganth activator solution, the substrates were rinsed and immersed in a solution containing about 1 gram/liter of sodium borohydride and about 0.5 grams/liter sodium hydroxide, which reduced the palladium compound to active palladium catalyst. The substrates were then rinsed and plated with electroless copper followed by electroplated copper. The average bond strength was 12.4 MPa (1800 psi).

EXAMPLE X

Example VIII was repeated ommitting the cleaner conditioner immersion step. Equivalent results were obtained except that there was reduced coverage with copper on the edges of the panel.

EXAMPLE XI

Example VI was repeated except that for the palladium tin chloride solution a commercial solution Catalyst 9-F TM from Shipley Company was used. Catalyst 9-F TM solution contains 0.6 g/l palladium, tin chlorides and 3.5 mole/l hydrochloric acid. Equivalent results were obtained.

EXAMPLE XII

This example shows how an admixture of $ZrO_2$ and NaOH can be used to etch an alumina ceramic.

Zirconium oxide powder is mixed into a container of 50% NaOH solution. After sufficient mixing, ceramic substrates are immersed into the admixture. After 10 minutes, the substrates are withdrawn and excess admixture is allowed to drain. The wet ceramic substrates are placed on edge in a support fixture. The resultant wet ceramic substrates are dried at 175° C. for 10 minutes to remove the water in the NaOH film. Next, the substrates are brought to 600° C. for 10 minutes and fused with the surface of the alumina to microroughen and adhesion promote the surface. After cooling for 5 minutes, the substrates are rinsed in water, rinsed in 20% sulfuric acid for 2 minutes at 25° C. and subsequently rinsed in deionized water for 2 minutes at 25° C. The substrates now can be catalyzed and electrolessly plated.

EXAMPLE XIII

Example IV, was repeated except the ceramic substrate was electroless by plated with nickel using a nickel-boron plating solution (commercially available from Allied Kelite Products Div. Des Plaines, Ill. 60018 as Niklad TM 752). The bond strength of the nickel to the silicon carbide surface was 27 MPa.

EXAMPLE XIV

Example II, is repeated, except the solid phase particles are mullite ($3Al_2O_3.2SiO_2$) particle size 40–100 mesh.

EXAMPLE XV

Example II, is repeated, except the concentration of the NaOH is 20%.

EXAMPLE XVI

Example II, is repeated, except the concentration of $Al_2O_3$ is 1% V/V.

EXAMPLE XVII

A mixture of 20 parts sodium carbonate, 4 parts potassium nitrate and 1 part kaolin are milled together in mortar with pestle. The milled mixture is applied to cover a surface of an alumina substrate. The substrate with the applied mixture is heated to 750° C. to melt the mixture on the substrate. The subtrate is then cooled and washed to remove the fused alkali metal composition matrix, and the substrate metallized by the procedure of Example 1.

EXAMPLE VIII

Example I is repeated except that the ceramic substrate is silicon carbide and the muffle furnace heated to 1000° C. for 15 minutes.

EXAMPLE XIX

A mixture of kaolin and sodium hydroxide pellets were ground together in a mortar with a pestle. The powder obtained was applied to cover a surface of an alumina substrate. The substrate with the applied powders was heated to 600° C. for seven minutes to melt the sodium hydroxide and form a matrix of kaolin and sodium hydroxide, and adhesion promote the alumina surface. The substrate was cooled, rinsed, neutralized and metallized by the procedures of Example 1.

EXAMPLE XX

An alumina substrate (99.5% alumina) was overlaid with a sheet of glass microfibre filter paper (commercially available as GF/A Filter paper from Whatman Ltd.) v. The alumina together with the overlaying filter paper was dipped in a 50% aqueous sodium hydroxide solution, and then placed in an oven at 600° C. for 15 miniutes. The coated surface bubbled slightly as the water evaporated, and then a uniform molten layer of sodium hydroxide was maintained without coalescence on the ceramic substrates. After cooling the substrate, it, was found that the glass filter paper had dissolved. After washing, the surface was found to be adhesion promoted and ready for metallization.

EXAMPLE XXI

A white alumina substrate (99.5% alumina) was adhesion promoted by the procedure of Example I. After washing, neutralizing and rinsing the surface, the surface was dried and coated with gold by the vacuum sputtering technique. A comparison substrate without adhesion promotion was coated with gold by the same technique. Both sputtered gold surfaces were reinforced with electroplated copper to a thickness of 25 micrometers. After plating the metallization blistered from the substrate without adhesion promotion. The substrate with adhesion promotion was tested by the dot pull test and had an average bond strength of 6.9 MPa (1000 psi). The bond strength of the substrate without adhesion promotion was too low to measure by the dot pull test.

EXAMPLE XXII

A stainless steel wire mesh is soaked in a 50% aqueous sodium hydroxide solution to provide an admixture containing sodium hydroxide and the wire mesh. The admixture as applied to a surface of a 96% alumina substrate, and the substrate and admixture are heated to a temperature of 600° C. for 7 minutes, to adhesion promote the surface of the alumina substrate. After washing and neutralizing the surface of the substrate, the treated surface is metallized by a conventional electroless metal deposition procedure.

What is claimed is:

1. In a process for metallizing a surface of a ceramic substrate which includes adhesion promoting the surface with an alkali metal composition containing one or more alkali metal compounds and subsequently depositing metal on the adhesion promoted surface, the improvement in said adhesion promoting step which comprises:
   providing an admixture comprised of said alkali metal composition and an inert solid material which is not dissolved or melted by the molten alkali metal composition up to and during the adhesion promotion step;
   contacting the ceramic surface with the admixture;
   heating the admixture and the substrate for a time period and at or above a temperature at which the alkali metal composition becomes molten and which is sufficient to adhesion promote the ceramic surface and render it receptive to subsequent adherent metal deposition, the presence of the inert solid material in the admixture preventing coalescence of the alkali metal composition on the ceramic surface during the adhesion promotion.

2. The process of claim 1, further comprising the step of forming the admixture by dispersing an inert solid material in finely divided form in an aqueous solution of an alkali metal compound.

3. The process of claim 1, further comprising the step of forming the admixture by grinding one or more alkali metal compounds and the inert solid material together.

4. The process of claim 1, further comprising the step of forming the admixture by dispersing the inert solid material in finely divided form in a melt of the alkali metal composition.

5. The process of claim 1, further comprising the step of forming the admixture by impregnating a fibrous base comprised of the inert solid material with the alkali metal composition.

6. The process of claim 1, wherein the ceramic substrate is selected from aluminas and beryllias and the ceramic surface is adhesion promoted for a time period between about 5 minutes and about 20 minutes.

7. The process of claim 1, wherein the ceramic substrate is selected from titanates, mullite, forsterite, steatites and porcelains and the ceramic surface is adhesion promoted for a time period less than about 5 minutes.

8. The process of claim 1, wherein the admixture is aged the equivalent of at least 12 hours at room temperature before being contacted with the ceramic surface.

9. The process of claim 1, wherein the adhesion promotion step is carried out at a temperature between about 150° C. and about 1200° C.

10. The process of claim 1, wherein the inert solid material is an alumina and the ceramic surface is adhesion promoted at a temperature between about 450° C. and about 700° C.

11. The process of claim 10, wherein the ceramic surface is adhesion promoted at a temperature between about 550° C. and about 650° C.

12. The process of claim 1, wherein the ceramic substrate is silicon carbide-beryllium oxide and the ceramic surface is adhesion promoted at a temperature between about 450° C. and about 700° C.

13. The process of claim 1, wherein the inert solid material is titanate and the titanate surface is adhesion promoted at a temperature between about 170° C. and about 450° C.

14. The process of claim 13, wherein the inert solid material is a titanate containing glasses which rapidly dissolve in the molten alkali metal composition or a titanate containing more than 10 percent glass and the ceramic surface is adhesion promoted at a temperature between about 170° C. and about 250° C.

15. The process of claim 1, wherein the inert solid material is silicon nitride and the silicon nitride surface is adhesion promoted at a temperature between about 250° C. and about 350° C.

16. The process of claim 1, wherein said molten alkali metal composition further includes up to about 50% by weight of one or more materials which depress the melting point of said alkali metal composition.

17. The process of claim 16, wherein said molten alkali metal composition further includes up to about 20% by weight of one or more materials which depress the melting point of said alkali metal composition.

18. The process of claim 1, wherein said alkali metal composition comprises an alkali metal compound selected from hydroxide, carbonates, nitrates and mixtures thereof.

19. The process of claim 18, wherein said alkali metal compound is selected from carbonates and nitrates and mixtures thereof.

20. The process of claim 1, wherein said alkali metal composition comprises an alkali metal compound selected from sodium hydroxide, potassium hydroxide, and sodium carbonate and potassium nitrate.

21. The process of claim 1, wherein a first metal layer is electrolessly formed on the adhesion promoted ceramic surface and said layer is further plated up to the desired thickness with one or more metals employing electroless or electroplating methods.

22. The process of claim 1, wherein the ceramic surface is adhesion promoted at a temperature above 150° C.

23. The process of claim 1, wherein the ceramic surface is adhesion promoted at a temperature above 300° C.

24. The process of claim 1, wherein the ceramic surface is adhesion promoted at a temperature between about 300° C. and about 650° C.

25. In a process for adhesion promoting a surface of a ceramic substrate to receive an adherent metal deposit, which process includes adhesion promoting the surface with an alkali metal composition at an elevated temperature, the improvement which comprises:
   providing an admixture comprised of said alkali metal composition dispersed throughout one or more inert solid materials which will remain solid in the presence of the alkali metal composition in a molten state and which will prevent coalescence of the alkali metal composition on the ceramic surface at least until the alkali metal composition wets the ceramic surface; and
   contacting the ceramic surface with the admixture at a temperature above about 150° C. and for a time period sufficient to adhesion promote the ceramic surface.

26. The process of claim 25, wherein the ceramic surface has a surface roughness less than about 0.7 micrometers.

27. A process for producing a printed circuit on a surface of a ceramic substrate comprising:
   (a) contacting the ceramic surface, with a molten alkali metal composition comprised of an alkali metal compound and an inert solid material in finely divided form to adhesion promote the surface, the inert solid material remaining solid in the presence of the alkali metal composition in a molten state and preventing coalescence of the alkali metal compositions at least until the alkali metal composition wets the ceramic surface;
   (b) treating the ceramic surface to activate it for electroless metal deposition;
   (c) depositing metal onto the activated surface; and
   (d) removing portions of the deposited metal to produce a metal printed circuit conductor pattern adhering to the surface of the ceramic substrate.

28. A process for producing a metallized conductor pattern on a surface of a ceramic substrate having a surface roughness less than about 0.7 micrometers, the process comprising:
   contacting the surface with a molten alkali metal composition comprised of one or more alkali metal compounds and inert inorganic oxide particles in finely divided form for a time period sufficient to adhesion promote said surface, the inert inorganic oxide particles not being dissolved or melted by the molten alkali metal composition up to and during the adhesion promotion;
   rinsing said surface with an aqueous solution;
   neutralizing said surface with an acid;
   repeating said rinsing step;
   contacting said surface with an activator solution providing stannous tin ions and precious metal ions, to render said surface receptive to electroless deposition of a metal; and
   contacting said surface or selected parts thereof with a metal depositing solution for a time period sufficient to form a metal layer thereon.

29. A process for bonding a first ceramic article to a second ceramic article provided with metallization, or to a metal article, comprising the steps of: adhesion promoting at least a portion of the surface of the first ceramic article with a molten alkali metal composition comprising one or more alkali metal compounds and an inert solid material which is not dissolved or melted by the alkali metal composition up to and during the adhesion promotion; adsorbing catalyst on the treated surface of the first ceramic article; depositing a coating of metal on the treated surface with a metal depositing bath; and metallurgically joining the metal coated portion of the first ceramic article to a metallized portion of the second ceramic article or to the metal article.

* * * * *